United States Patent
Aderhold et al.

(10) Patent No.: US 7,414,224 B2
(45) Date of Patent: Aug. 19, 2008

(54) BACKSIDE RAPID THERMAL PROCESSING OF PATTERNED WAFERS

(75) Inventors: Wolfgang Aderhold, Cupertino, CA (US); Sundar Ramamurthy, Fremont, CA (US); Aaron Hunter, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/610,759

(22) Filed: Dec. 14, 2006

(65) Prior Publication Data

US 2007/0104470 A1    May 10, 2007

Related U.S. Application Data

(63) Continuation of application No. 10/788,979, filed on Feb. 27, 2004.

(51) Int. Cl.
*F27B 5/14*    (2006.01)
*A21B 2/00*    (2006.01)
(52) U.S. Cl. .................................. 219/390; 392/416
(58) Field of Classification Search ................. 219/390, 219/405, 411; 392/416, 418; 118/724, 725
See application file for complete search history.

(56) References Cited

U.S. PATENT DOCUMENTS

| | | | |
|---|---|---|---|
| 4,891,499 A * | 1/1990 | Moslehi | 219/502 |
| 4,956,538 A * | 9/1990 | Moslehi | 219/121.6 |
| 5,156,820 A | 10/1992 | Wong et al. | |
| 5,755,511 A | 5/1998 | Peuse et al. | |
| 5,848,842 A | 12/1998 | Peuse et al. | |
| 6,090,210 A | 7/2000 | Ballance et al. | |
| 6,123,766 A | 9/2000 | Williams et al. | |
| 6,179,466 B1 | 1/2001 | Peuse et al. | |
| 6,226,453 B1 | 5/2001 | Yam et al. | |
| 6,395,363 B1 | 5/2002 | Ballance et al. | |
| 6,455,814 B1 | 9/2002 | Samoilov et al. | |
| 6,570,137 B1 | 5/2003 | Jennings | |
| 6,839,507 B2 | 1/2005 | Adams et al. | |
| 7,041,931 B2 | 5/2006 | Jennings et al. | |
| 2002/0068422 A1 * | 6/2002 | Dairiki et al. | 438/530 |
| 2004/0052512 A1 | 3/2004 | Aderhold et al. | |

* cited by examiner

*Primary Examiner*—S Paik
(74) *Attorney, Agent, or Firm*—Diehl Servilla, LLC

(57) ABSTRACT

Apparatus and methods of thermally treating a wafer or other substrate, such as rapid thermal processing (RTP) apparatus and methods are disclosed. An array of radiant lamps directs radiation to the back side of a wafer to heat the wafer. In one or more embodiments, the front side of the wafer on which the patterned integrated circuits are being formed faces a radiant reflector. In one or more embodiments, the wafer is thermally monitored for temperature and reflectivity from the side of the reflector.

10 Claims, 6 Drawing Sheets

US 7,414,224 B2

BACKSIDE RAPID THERMAL PROCESSING OF PATTERNED WAFERS

CROSS-REFERENCE TO RELATED APPLICATIONS

The present application is a continuation of U.S. patent application Ser. No. 10/788,979, filed on Feb. 27, 2004 and entitled, Backside Rapid Thermal Processing of Patterned Wafers, the entire content of which is incorporated herein by reference.

FIELD OF THE INVENTION

Embodiments of the invention relate generally to heat treatment of semiconductor wafers and other substrates. In particular, embodiments of the invention relate to rapid thermal processing of wafers from a radiant source, such as an array of incandescent lamps.

BACKGROUND ART

The fabrication of integrated circuits from silicon or other wafers involves many steps of depositing layers, photo lithographically patterning the layers, and etching the patterned layers. Ion implantation is used to dope active regions in the semiconductive silicon. The fabrication sequence also includes thermal annealing of the wafers for many uses including curing implant damage and activating the dopants, crystallization, thermal oxidation and nitridation, silicidation, chemical vapor deposition, vapor phase doping, thermal cleaning, and other reasons. Although annealing in early stages of silicon technology typically involved heating multiple wafers for long periods in an annealing oven, rapid thermal processing, (RTP) has been increasingly used to satisfy the ever more stringent requirements for ever smaller circuit features. RTP is typically performed in single-wafer chambers by irradiating a wafer with light from an array of high-intensity lamps directed at the front face of the wafer on which the integrated circuits are being formed. The radiation is at least partially absorbed by the wafer and quickly heats it to a desired high temperature, for example above 600° C., or in some applications, above 1000° C. The radiant heating can be quickly turned on and off to controllably heat the wafer over a relatively short period, for example, of a minute or less, or even a few seconds.

FIG. 1 schematically represents a Radiance RTP reactor 10, available from Applied Materials, Inc. of Santa Clara, Calif. Peuse et al. describe further details of this type of reactor and its instrumentation in U.S. Pat. Nos. 5,848,842 and 6,179,466, all incorporated herein by reference in their entireties. A wafer 12 to be thermally processed is supported on its periphery by an edge ring 14 having an annular sloping shelf 15 contacting the corner of the wafer 12. The size of wafers is currently transitioning from 200 mm to 300 mm in diameter. Ballance et al. more completely describe the edge ring and its support function in U.S. Pat. No. 6,395,363, incorporated herein by reference in its entirety. The wafer is oriented such that processed features 16 already formed in a front surface of the wafer 12 face upwardly, referenced to the downward gravitational field, toward a process area 18 defined on its upper side by a transparent quartz window 20. Contrary to the schematic illustration, the features 16 for the most part do not project substantial distances beyond the surface of the wafer 12 but constitute patterning within and near the plane of the surface. The nature of the wafer features 16 is multi-faceted and will be discussed later. Three lift pins 22 may be raised and lowered to support the back side of the wafer 12 when the wafer is handed between a paddle bringing the wafer into the chamber and the edge ring 14. A radiant heating apparatus 24 is positioned above the window 20 to direct radiant energy toward the wafer 12 and thus to heat it. In the Radiance reactor 10, the radiant heating apparatus includes a large number, 409 being an exemplary number, of high-intensity tungsten-halogen lamps 26 positioned in respective reflective hexagonal tubes 27 arranged in a close-packed array above the window 20. However, other radiant heating apparatus may be substituted. Generally, these involve resistive heating to quickly ramp up the temperature of the radiant source.

It is important to control the temperature across the wafer 12 to a closely defined temperature uniform across the wafer 12. One passive means of improving the uniformity includes a reflector 28 extending parallel to and over an area greater than the wafer 12 and facing the back side of the wafer 12. The reflector 28 efficiently reflects heat radiation emitted from the wafer 12 back toward the wafer 12. The spacing between the wafer 12 and the reflector 28 is preferably within the range of 3 to 9 mm, and the aspect ratio of the width to the thickness of the cavity is advantageously greater than 20. The reflector 28, which may be formed of a gold coating or multi-layer dielectric interference mirror, effectively forms a black-body cavity at the back of the wafer 12 that tends to distribute heat from warmer portions of the wafer 12 to cooler portions. In other embodiments, for example, as disclosed in U.S. patent applications Ser. No. 10/267,053, filed Oct. 7, 2002 and Ser. No. 10/280,660, filed Oct. 24, 2002, both incorporated herein by reference in their entireties, the reflector 28 may have a more irregular surface or have a black or other colored surface to more closely resemble a black-body wall. The black-body cavity is filled with a distribution, usually described in terms of a Planck distribution, of radiation corresponding to the temperature of the wafer 12 while the radiation from the lamps 26 has a distribution corresponding to the much higher temperature of the lamps 26. Preferably, the reflector 28 is deposited on a water-cooled base to heat sink excess radiation from the wafer, especially during cool down.

A kinetic means of improving the uniformity includes supporting the edge ring 14 on a rotatable cylinder 30 that is magnetically coupled to a rotatable flange 32 positioned outside the chamber. An unillustrated motor rotates the flange 32 and hence rotates the wafer about its center 34, which is also the centerline of the generally symmetric chamber.

An electrical means of improving the uniformity divides the lamps 26 into, for example, 15 zones arranged generally ring-like about the central axis 34. Control circuitry varies the voltage delivered to the lamps 26 in the different zones to thereby tailor the radial distribution of radiant energy. Dynamic control of the zoned heating is effected by, for example, 8 pyrometers 40 coupled through optical light pipes 42 positioned to face the back side of the wafer 12 through apertures in the reflector 28 to measure the temperature across a radius of the rotating wafer 12. The light pipes 42 may be formed of various structures including sapphire, metal, and silica fiber. A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 to 1000 nm. The controller 44 or other instrumentation converts the light intensity to a temperature through the well known Planck distribution of the spectral distribution of light intensity radiating from a blackbody held at that temperature. Pyrometry, however, is affected by the emissivity of the portion of the wafer 12 being scanned. Emissivity ϵ can vary between 1 for a black body to 0 for a perfect reflector and thus is an inverse measure of the reflectivity R=1−ϵ of the wafer back side. While the back surface of a wafer is typically uniform so that uniform emissivity is expected, the backside composition may vary depending upon prior processing. The pyrometry can be improved by further including a emissometer to optically probe the wafer to measure the emissivity or reflectance of the portion of the wafer it is facing in the relevant wavelength range and the control algorithm within the controller 44 to include the measured emissivity.

Bulk silicon representative of the wafer back side has an emissivity ϵ. of about 0.7. In comparison, the front surface of a semiconductor wafer for integrated circuit (IC) manufacturing is subject to RTP while its front surface is composed of polysilicon and nitride portions. As a result, a typical front side emissivity is about 0.8 to 0.9. That is, the back side is more reflective than the front side.

Although the above temperature control has been effectively used to greatly improve the close and uniform control of temperature, increasingly difficult fabrication constraints necessitate yet further and tighter control. One of the difficulties is that the emissivity or absorption on the front side of the wafer greatly varies over the wafer's area. The non-uniformity arises from several origins. First, integrated circuits are invariably rectangularly shaped but arranged on a circular wafer. As illustrated in the plan view of FIG. 2, a large number of identical integrated circuit die 50 having rectangular shapes are arranged on the circular wafer 12. The arrangement of the die 50 avoids an edge exclusion zone 52 at the periphery of the wafer 12. The edge exclusion zone 52, typically having a width of about 2 mm, is felt to be unduly affected by edge effects such that any die 50 located within the edge exclusion zone 52 is highly likely to be defective or at least non-uniform relative to die 50 located closer to the wafer center. The die 50 are fundamentally patterned in a photographic process including for most advanced processing an optical stepper which successively projects a single image of the developing integrated circuit onto the area of one die 50 and is then stepped to another die to repeat the imaging process. Except for the stepper imaging, the remaining steps of the semiconductor fabrication process processes all die 50 simultaneously. At the end of processing, the die 50 are separated across kerfs 54 separating the die 50 to form separate integrated chips or circuits.

The temperature distribution in rapid thermal processing has been observed to depend upon the patterning of wafer and to vary from one level to another in the developing circuitry as well as between different IC structures. As a result of the rectangular die arrangement on a circular wafer, relatively large structured die regions 56 develop at several locations near the periphery of the wafer 12. These regions are not exposed to the stepper imaging. As a result, while the structured die regions 56 are processed along with the die 50, no pattern develops there. In contrast, as the multi-step and multi-level processing proceeds, the die 50 begin to develop a distinct pattern across the components of the developing integrated in which multiple layers produce a rapidly varying emissivity. On the dimensional scale of IC features, the emissivity variations can be averaged to an effective emissivity across the individual die 50. This effective emissivity, however, likely varies from the unpatterned emissivity of the structured die regions 56. An associated problem is that some of the internal die 50 may be used for test structures or patterns other than the production integrated circuits. These different die will have effective emissivities different than the production ICs. As a result, they absorb a different amount heat of heat than do the production ICs so that temperature uniformities arise near the test structures. A related problem arises from the kerfs 54 which must be kept wide enough for a saw but are generally unpatterned. As result, temperatures may vary near the kerfs. Similarly, if an IC has a distinct macro-pattern, such as RAM versus logic, the effective emissivities of the two areas may differ, producing temperature non-uniformities within the chip. It is possible that some areas of the die 50 develop a stack structure that acts as an interference filter for the high-temperature radiation from the lamps 26. These interference effects become more pronounced as higher-temperature lamps shift the radiation spectrum closer to film thicknesses. Even single layers of a different material may introduce significant reflection because of the abrupt change in refractive index.

A further problem is that the edge ring 14 may have a substantially higher emissivity than the structure developing on the wafer 12, which may be highly reflective. As a result, the edge ring 14 absorbs more radiation and heats to a higher temperature than the bulk of the wafer 12, resulting in the wafer 12 being hotter at its periphery than in its more central portions. This problem has been partially circumvented by tailoring the emissivity of the edge ring 14 by the use of coatings to more closely resemble the emissivity of the wafer. However, the wafer emissivity depends upon the IC design and the point in the fabrication process. Therefore, this solution in its extreme requires separate edge rings for each IC design and each step of the process, obviously an inconvenient and costly solution.

Aderhold et al. have addressed some of the problems with structure die regions 56 as well as some other macro non-uniformities in U.S. patent application, Ser. No. 10/243,383, filed Sep. 12, 2002. Their method electronically filters the pyrometer readings in those rings of the wafers exhibiting large circumferential temperature variations. Nonetheless, further improvements in uniformity in RTP are desired.

SUMMARY OF THE INVENTION

Embodiments of the invention pertains to a rapid thermal process and rapid thermal processing apparatus, in which a substrate is held with its back side in opposition to a radiant heat source while its front side on which the features such as integrated circuits or SOI surface layers face away from the heat source. The substrate front side may face a radiant reflector. Thereby, a black-body or radiation cavity may be formed between the featured front side and reflector. The front side may be thermally monitored, for example, by monitoring ports formed through the reflector.

In one embodiment, a rapid thermal processing apparatus for heating substrates is provided comprising a radiant heat source directing radiant energy upwardly and configured to be quickly turned on and off to controllably heat the substrate to above 1000° C. within a minute or less; a reflector disposed above said radiant heat source; and a support for holding a substrate between said reflector and said radiant heat source with a processing side of said substrate facing said reflector. In one embodiment, the support comprises a ring supporting a peripheral portion of said substrate. According to one or more embodiments, the reflector extends generally horizontally over a substantial portion of said radiant heat source. In certain embodiments, the reflector extends over an area greater than that of said substrate. In one embodiment, the support is located so that a wafer on the support defines cavity between the substrate and the reflector that tends to redistribute heat from hotter parts of the substrate to cooler parts of the substrate, thereby evening the temperature distribution across the substrate.

Another aspect of the invention pertains to a method of rapid thermally processing a substrate in a reactor comprising disposing a substrate in a processing chamber on an edge ring to support the substrate above an array of radiant heating lamps, the substrate having a front side having features formed therein and a backside, the backside of the substrate facing the heating lamps; turning the lamps on and off to controllably heat the substrate to above 600° C. within a minute or less; and thermally monitoring said front side of said substrate.

DETAILED DESCRIPTION OF THE PREFERRED EMBODIMENTS

The uniformity of rapid thermal processing (RTP) is greatly enhanced if the unpatterned back side of the wafer is positioned to face the radiant heat source and the patterned front side faces a reflector and is dynamically monitored for its temperature. As used herein, the phrase "rapid thermal processing" refers to methods or apparatus that produce that can quickly heat wafers to a desired high temperature, for example above 600° C., or in some applications, above 1000° C. According to one or more embodiments, as described above, the radiant heating of an RTP apparatus can be quickly turned on and off to controllably heat the wafer over a relatively short period, for example, of a minute or less, or even a few seconds.

Figure 1:
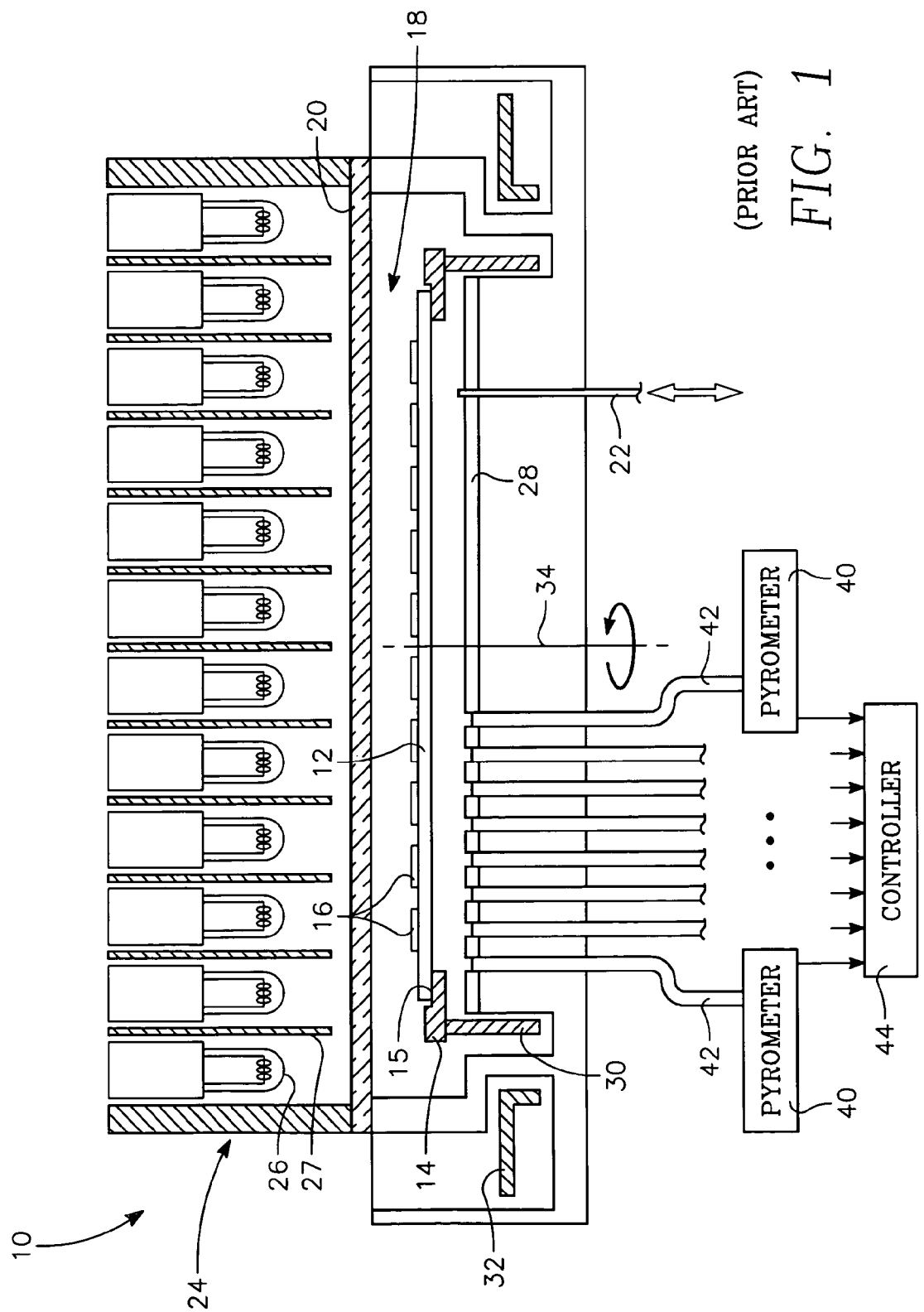
FIG. 1 is a schematic cross-sectional view of a conventional RTP reactor.
Figure 2:
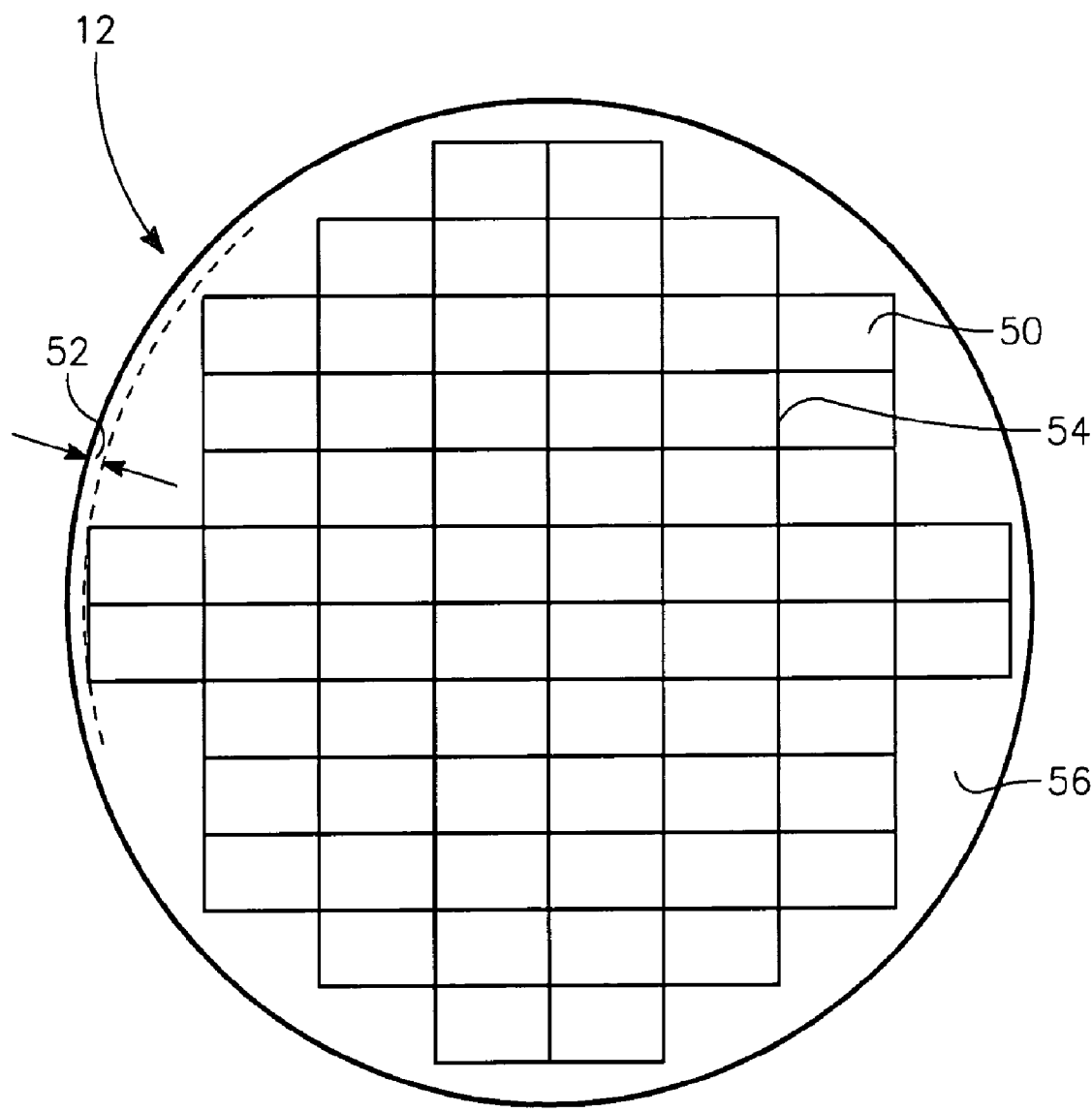
FIG. 2 is a plan view of the die arranged on a wafer.
Figure 3:
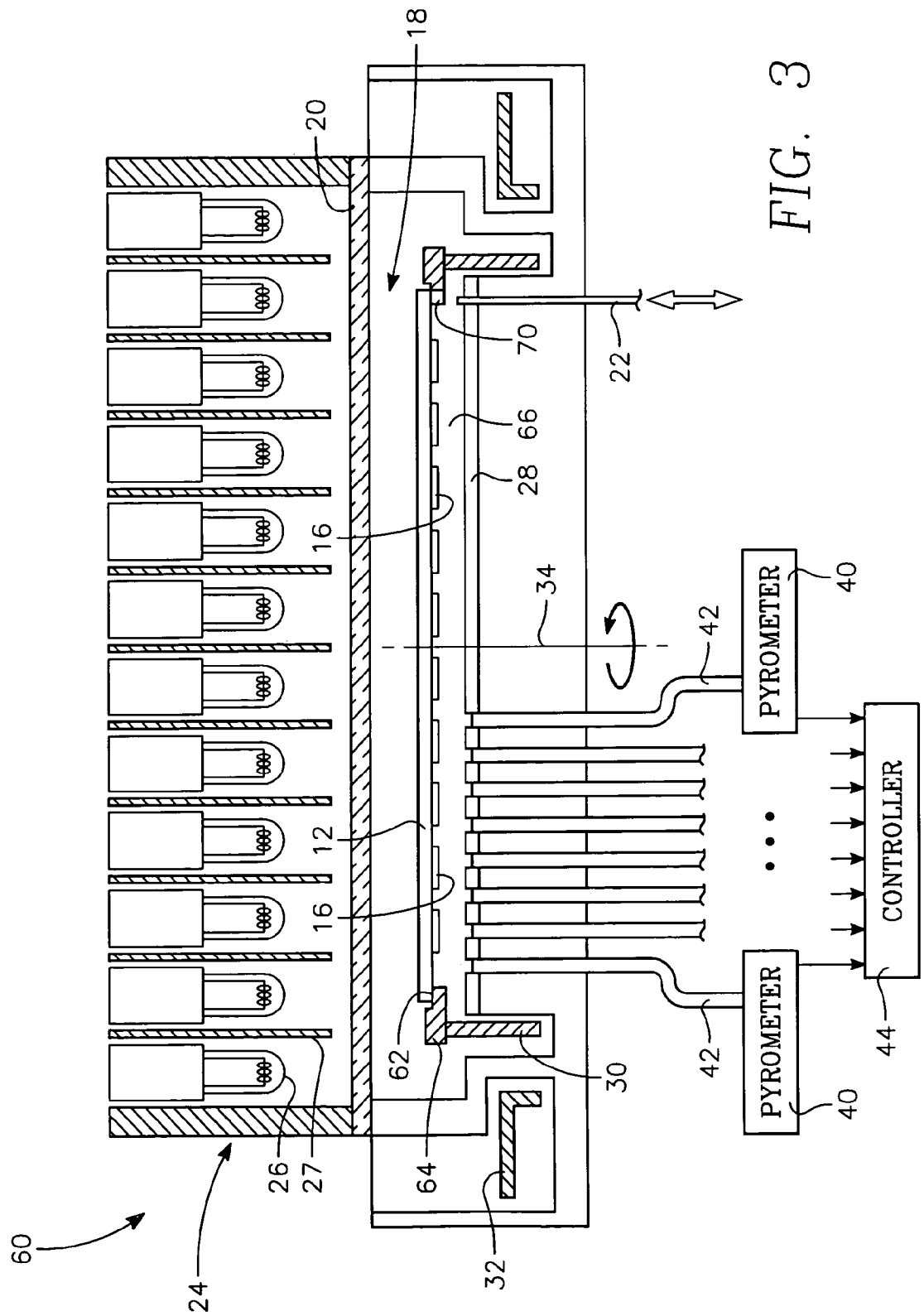
FIG. 3 is schematic cross-sectional view of an RTP reactor in which the invention may be practiced.

As illustrated in the schematic cross-sectional view of FIG. 3, backside RTP can be effected within an RTP reactor 60 that differs in only a few ways from the reactor 10 of FIG. 1 for front side processing.

Figure 4:
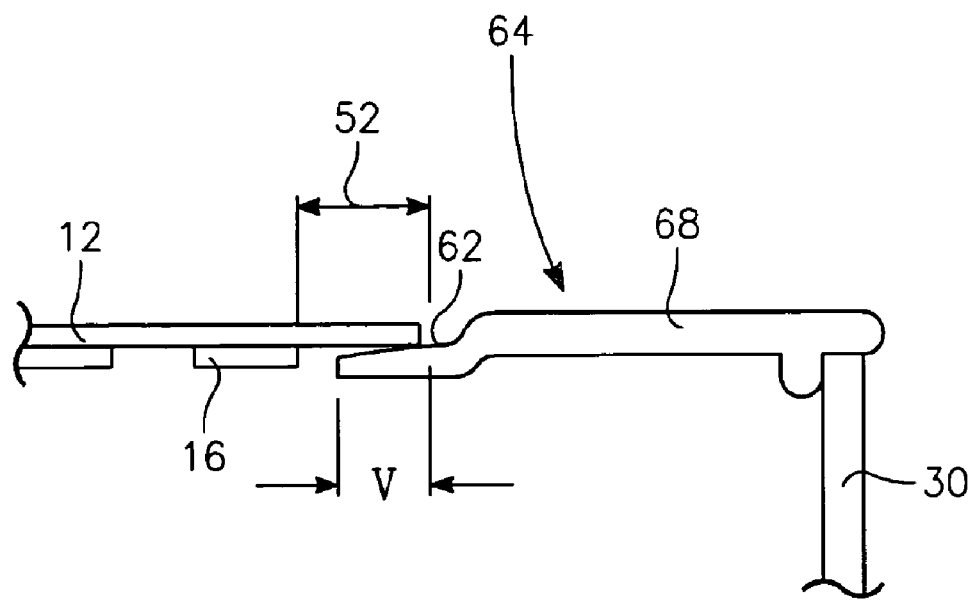
FIG. 4 is an exploded section of the cross-sectional view of FIG. 3 showing the wafer supported on the edge ring.

In one embodiment, a generally annular and sloping shelf 62 of an edge ring 64, as better illustrated in the cross-sectional view of FIG. 4, supports a beveled corner of the inverted wafer 12 oriented with its features 16 constituting the developing integrated circuits facing downwardly toward the reflector plate 28. The edge ring shelf 62 is generally shortened over the conventional shelf 15 (shown in FIG. 1) so that edge ring shelf 62 shields the wafer 12 from the reflector 28 by a distance V that less than the wafer edge exclusion zone 52. That is, none of the die 50 are shielded. For example, for a 3 mm edge exclusion zone 52, the shelf 62 could overlap the wafer 12 for a distance V of no more than 2 mm extending from the periphery of the wafer. That is, the inner diameter of the shelf 62 should be no greater than wafer diameter less twice width of the edge exclusion zone. For a design of 2 mm overlap, the shelf inner diameter is 4 mm less than the wafer diameter. This positioning also places all the die 50 within the black-body cavity 66 at the bottom of the wafer 12 and also prevents the die from being scraped if the wafer 12 is mishandled during loading. Otherwise, the patterned front side of the wafer 12, now facing downwardly to the reflector 28, is not mechanically contacted.

This inverted orientation offers several advantages. First, the emissivity of the unpatterned wafer backside facing the radiant lamps 26 is generally constant so that the same amount of heat is absorbed per unit area of the wafer for a given lamp voltage regardless of the presence of structured die regions, kerfs, or internal IC structure on the wafer front side. Furthermore, the wafer back side is generally less reflective than the wafer front side so that radiant heat is more readily absorbed by the back side. Even across the microstructure of the IC, highly emissive regions are also highly absorptive, thus evening the temperature between micro-regions of differing emissivities. The back side radiant heating benefits even silicon-on-insulator (SOI) substrates being thermally processed prior to patterning. The otherwise unpatterned front SOI wafer surface contains a thin layer of silicon readily penetrated by the incandescent radiation and underlain by a thin oxide layer so that it may be considered to patterned vertically rather than horizontally. The oxide layer may act as a reflector and further is subject to lateral variations in thickness, introducing possible absorption variations. Backside heating of the SOI wafer avoids these problems.

A second advantage is that a region between the wafer 12 and the reflector 28 effectively forms a black-body cavity 66 that tends to redistribute heat from hotter parts of the wafer 12 to cooler parts, thereby evening the temperature distribution across the wafer 12. The terminology of black-body cavity should perhaps be replaced by radiation cavity, particularly if the reflector 28 is reflective rather than black or darkened. Nonetheless, the radiation cavity 66 acts to average out the radiation emitted from the wafer back side and thus increases the temperature uniformity over the wafer 12.

A third advantage is that the pyrometers 40 more directly measure the temperature of the IC die since the pyrometer optical light pipes 42 are directly facing the die rather than the side of the wafer 12 opposite the die. The emissivity does vary over a microscopic scale within the die 50 and over a macroscopic scale because of the structured die regions 56 and possible test structures. For temperature measurements, the microscopic patterning is not directly evident to the large-aperture pyrometer systems and the macroscopic patterning can be removed by the method described in the aforecited patent application Ser. No. 10/243,383.

A fourth advantage is that temperature ramp down and thermal sinking are increased if the more emissive wafer front side is facing the reflector 28, which may be dynamically cooled in the reactor described by Peuse et al. Fast cool-down rates are promoted by filling the black-body cavity 66 with a more highly thermally conductive gas such as helium.

A fifth advantage is that the emissivity of the edge ring may be more easily matched to that of the back side of the wafer so that the lamps heat both of them to the same temperature. The wafer back side is generally non-patterned and does not typically vary significantly between IC designs or process steps. Generally, a silicon surface on the edge ring will display nearly the same emissivity as the back side of a silicon wafer although silicon nitride or silicon oxide coatings may be advantageously employed.

According to a sixth advantage, although supporting the wafer within the edge exclusion zone presents some difficulties, it reduces the contact area between the wafer and its support, thereby reducing the production of particles.

The described orientation differs from using radiant heating directed at both wafer surfaces. While the opposed radiant heating has advantages, it makes it very difficult to thermally monitor the wafer since both wafer sides are bathed in intense radiant energy which emanates from the very hot lamps and is not indicative of the wafer temperature. In contrast, the black-body cavity formed between the wafer front side and the reflector described above have radiant energy distribution close to that of the wafer since the black-body cavity is thermally driven through the wafer.

Using an inverted wafer orientation in an RTP reactor for the most part designed for conventional upwardly facing orientation presents some difficulties with wafer handling. As mentioned above, the wafer 12 should be supported on its periphery only within its edge exclusion zone 52. Transferring the wafer into and out of reactor requires further modifications. The lift pins 22 in a conventional RTP reactor 10 typically contact the back side of the wafer 12 at positions underlying production die. Such contact in the inventive reactor 60 with the die will most likely introduce sufficient damage to the contacted die to render the die inoperable. Such damage could be accepted as trading off yield of a limited number of die. The die areas may even be left unimaged. However, this approach is disfavored, since yield is not readily surrendered. Further, to minimize yield loss for such RTP processing on multiple levels, it becomes important to rigidly maintain the orientation of the wafer patterning relative to the lift pin locations. Another approach moves the lift pins to areas of the structured die regions, which do not yield useful die in any case. This solution has its own disadvantages. First, it again requires careful orientation of the wafer patterning relative to the lift pin locations. Secondly, different integrated circuit designs likely have different die sizes and ratio of length to width. As a result, the structured die areas may vary from one IC design to another. Accordingly, it may be necessary to move the locations of the lift pins when processing a different IC design. Although feasible, this design specific location of lift pins is feasible but economically disadvantageous.

Figure 5:
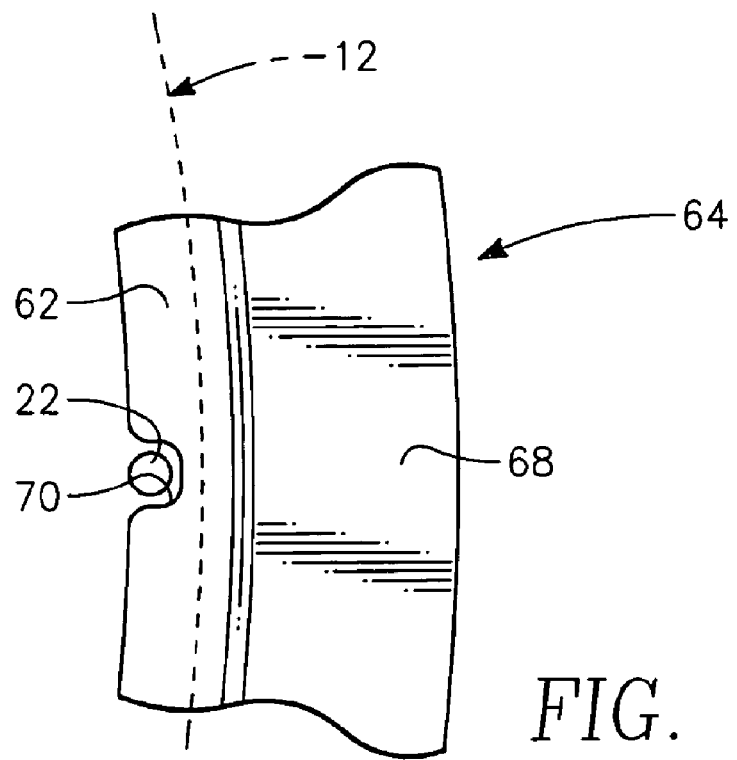
FIG. 5 is plan view of a portion of the edge ring modified to accommodate lift pins positioned at the edge of the wafer.

A third approach, illustrated in FIG. 5, moves the lift pins to the edge exclusion zone 52 of the wafer 12, preferably within the same peripheral wafer region overlapping the edge ring shelf 62, for example, the outer 2 mm of the wafer 12 and the inner 2 mm of the edge ring shelf 62. As a result, the edge ring 62 requires some redesign around the areas of the lift pins 22. It is noted that the edge ring 62 rotates during conventional operation while, of course, the lift pins 22 do not. However, the aforecited patent application Ser. No. 10/243,383 discloses apparatus for assuring that the edge ring rests in a known angular position. As illustrated in the plan view of FIG. 4, the edge ring 62 has a shape generally corresponding to that disclosed by Ballance et al. in U.S. Pat. No. 6,395,363 in which the wafer 12 is supported on the shelf 60 which slopes inwardly and downwardly at a few degrees from a outwardly extending back ring 68 that rests on the rotating cylinder 30. The sloping shelf 60 acts to center the wafer 12 on the edge ring 62. To accommodate the lift ring 22 positioned to correspond to the wafer edge exclusion zone 52, a cut out 70 is formed in the inner periphery of the shelf 62 to allow the lift pin 22 to pass the edge ring 64 and support the wafer 12 above the edge ring shelf 62. However, to prevent light leakage around the edge ring 64, the cut outs 70 should reliably extend no further outwardly than the edge of the wafer 12. Such a structure is replicated for all the lift pins 22. Although the edge ring 64 provides minimal overlap to the wafer 12 in the areas of the cut outs 22, the majority of the shelf 62 continues to overlap the wafer 12 in its edge exclusion zone 52.

However, other support configurations are possible, for example, the flat shelf described in more detail by Peuse et al. in U.S. Pat. No. 6,179,466, in which the wafer contacts a substantial radial extent of the edge ring shelf. There may be actual extended contact of the edge ring 64 to the wafer 12 within the wafer edge exclusion zone 52. The support should be designed to minimize the leakage of the high-temperature radiant energy from the radiant heat source 24 around the edge ring on either its inner or outer side. That is, the wafer must be light sealed to the edge ring. Also, it is possible that the edge ring 64 overlap the die 50 inside the edge exclusion zone 52 as long as no contact is made to the die 50 and the edge ring 64 does not degrade the temperature uniformity across the die 50.

The cut outs 70 can be replaced by apertures, which however require closer tolerances.

The inverted configuration of FIG. 3 benefits from moving the outermost light pipe 42 closer to the edge to be directed toward the edge ring 64 with a field of view to sample only the edge ring temperature and control the heating pattern accordingly. Unlike the patterned wafer front side, the edge ring 64 has substantially constant emissivity that likely differs from that of the wafer front side. As a result, the edge ring pyrometry does not require the emissivity correction provided by the emissometer directed at the die area.

Figure 6:
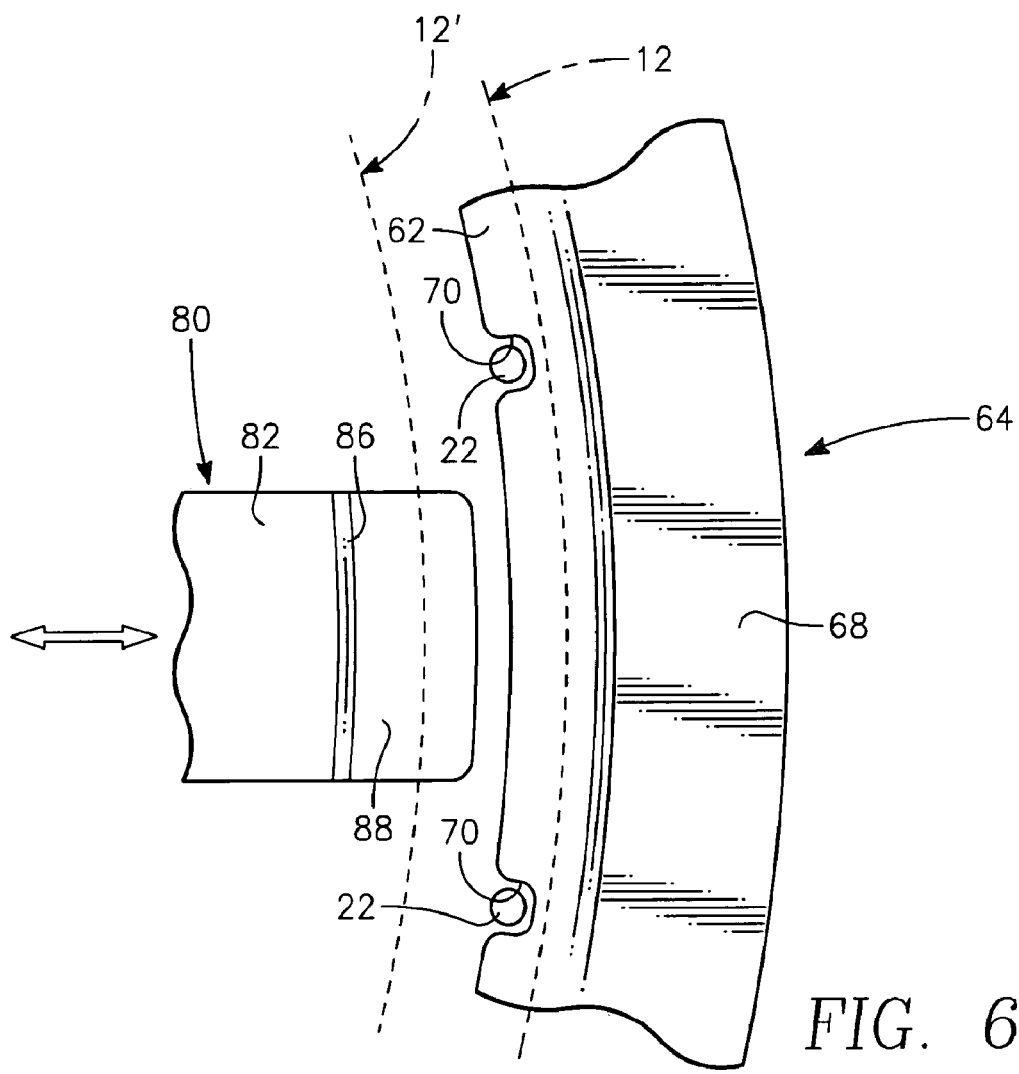
FIG. 6 is a plan view of a portion of the edge ring and the paddle transferring a wafer to the edge ring.

The inverted orientation of the wafer also requires modification of the paddle or other apparatus used to transfer the wafer into and out of the reactor. Typical transfer paddles support the wafer on significant portions of the wafer's gravitational bottom, which would likely incur severe damage if the bottom contains the developing IC structure. A modified paddle 80 configured for use with the inverted orientation of the invention is illustrated in plan view in FIG. 6. The paddle 80 includes a substantially flat inner portion 82 having on each of its two axial ends a transition 88 to a support end 88, which slopes upwardly in the outward direction while being circularly symmetric about the wafer center. The sloping support end 88 supports a beveled corner of a wafer 12' in a configuration similar to that of the edge ring 68 with the central part of the wafer 12' elevated above the central paddle portion 82. A similar end configuration occurs at the opposite unillustrated end of the paddle 80. The principle motion of paddle is along the axis of the paddle to transfer the wafer 12' to and from the edge ring 64. In one configuration, the paddle 80 and its support arm cantilevered away from the outside of the edge ring 64 can be positioned always above the edge ring 64. Two lift pins 22 are located outside the path of the paddle 80. Both paddle ends may be split into fingers having separate sloping support ends. On the distal end of the paddle, a single support pin may be located between the fingers rather than outside the paddle path.

For transferring a wafer in, when the paddle has brought the wafer 12' to the processing position indicated by wafer 12, the lift pins 22 rise and lift the wafer off the paddle 80, which then withdraws. The lift pins 22 then lower to leave the wafer 12 supported on the edge ring 64. Transferring a wafer out requires the opposite sequence.

Figure 7:
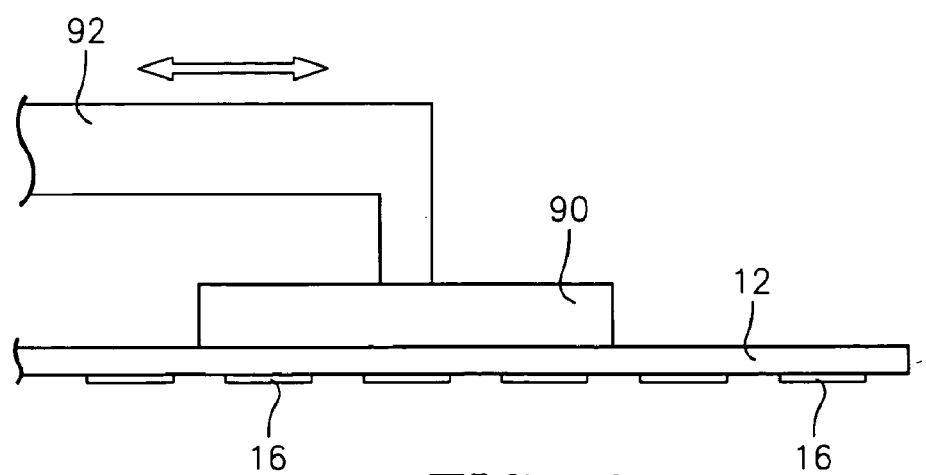
FIG. 7 is a schematic cross-sectional view of a mechanism for selectively holding a wafer from a top surface.

Another approach for wafer transfer includes top side detachable holding means. For example, as illustrated in the schematic cross-sectional view of FIG. 7, a detachable holding member 90 when activated can support the wafer 12 on its featureless back side against the force of gravity. When the holding member 90 is inactivated, it is easily detached from the wafer by movement in the vertical direction. The holding member 90 in turn is supported by a horizontally extending support arm 92 which is movable in the horizontal direction to bring the holding member 90 into the RTP reactor to overlie the edge ring under the heating lamps and to withdraw from the chamber for thermal processing. If the chamber pressure is near atmospheric during wafer transfer, for example, above 1 Torr, the holding member 90 may be implemented as a pneumatic cup that is vacuum sealable on its periphery to the wafer 12. When the pneumatic cup is pumped to a vacuum can through a vacuum line in the support arm, it holds the wafer 12 from above but, when the cup is returned to chamber pressure, it can be detached from the wafer 12. If the wafer transfer is performed under high vacuum, the holding member 90 may be implemented as an electrostatic chuck with the chuck electrode embedded in the bottom face of the holding member. Under proper electrical biasing, the electrostatic chuck tightly holds the wafer 12.

The top side detachable holding member can be combined with lift pins so that the holding member transfers the wafer to the extended lift pins which then lower the wafer to the edge ring. If the support arm 92 is movable in the vertical as well as horizontal direction, the detachable holding member can directly deposit the wafer onto the edge ring and lift it from there after processing.

Orienting the wafer with its front side facing downwardly is opposite the convention of always keeping the front side facing upwardly, both within the reaction and transfer chambers and within cassettes used to move batches of wafers. Accordingly, suitable modifications need be made in the processing outside of the thermal processing step.

If active processing gases are used for the thermal processing, whether for chemical vapor deposition, for nitridation or oxidation, or for vapor phase doping, the gas injection ports and the pumping port must provide an adequate flow of gas to and from the black-body cavity 66 between the reflector 28 and the wafer 12. Advantageously, the transparent window 20 may be better shielded from the process gases than in the conventional design, thereby reducing the build up of a blocking layer on the window 20.

Figure 8:
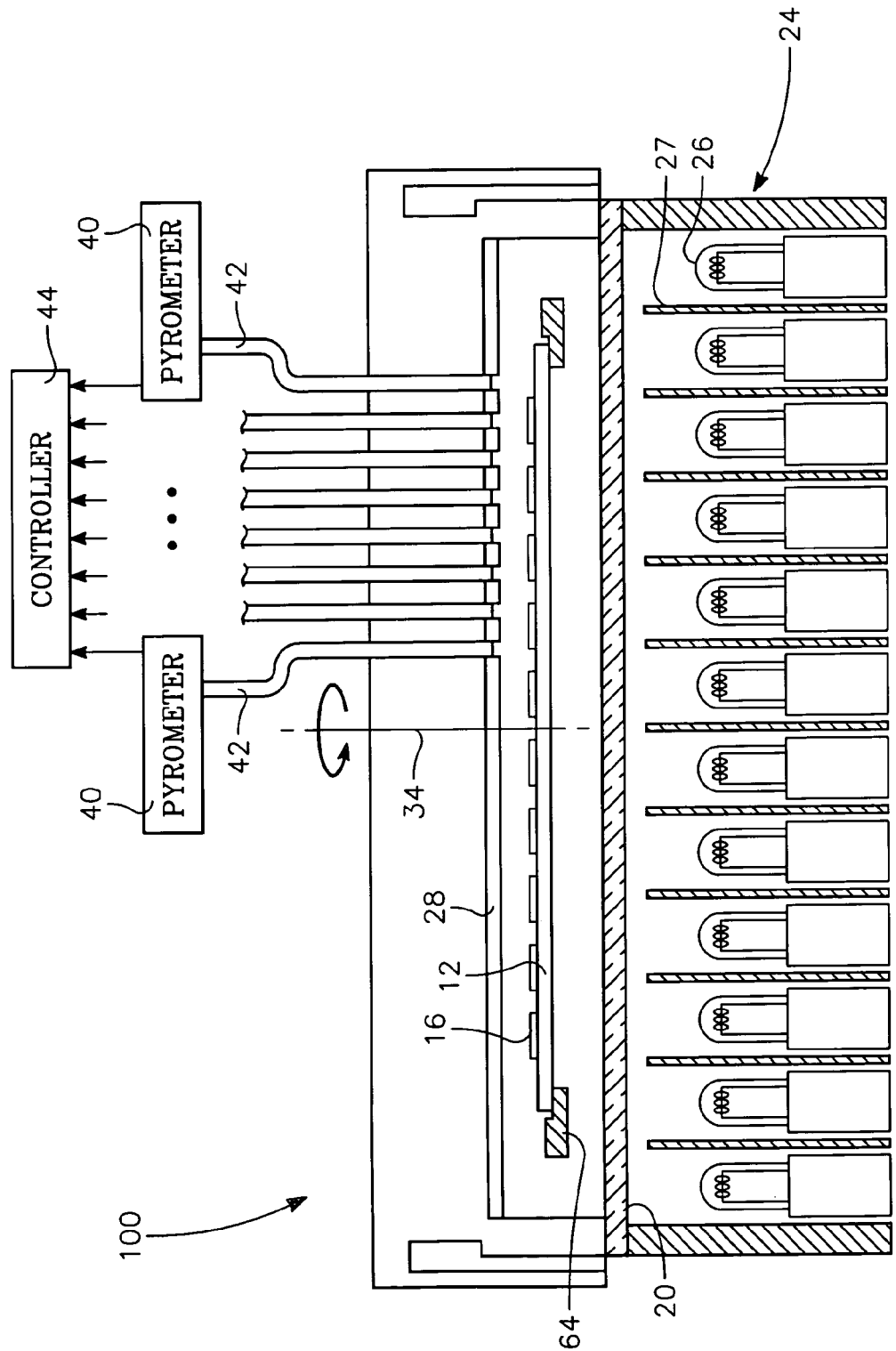
FIG. 8 is a schematic cross-sectional view of an RTP reactor radiantly heated from below.

Although the embodiments described above are adaptable to present designs of RTP chambers, the complexities of wafer support and handling are reduced in an inverted RTP reactor 100 illustrated in FIG. 8 in which the radiant heating apparatus 24 is located below the wafer 12 and the reflector 28 and thermal monitoring light pipes are located above the wafer 12. The wafer 12 is oriented in the conventional direction with its features 16 facing upwardly towards the reflector 28 and so that the radiant heating apparatus 24 irradiates the unpatterned back side of the wafer 12. As a result, the wafer 12 can be transferred into and out of the reactor 100 on a conventional wafer paddle holding the wafer 12 on its unpatterned back side. Although the dimensions of the edge ring are not so critical when it supports the wafer on its back side, nonetheless, the extent of the edge ring shelf should be minimized so that the edge ring does not substantially shield the area of the back side opposite production from the radiant heating. Although unillustrated, rotation means should be provided to rotate the wafer 12 about its center. As shown in FIG. 8, the reflector 28 has a diameter greater than the diameter of the wafer 12. Like the embodiment shown in FIG. 3, a region between the wafer 12 and the reflector 28 effectively forms a cavity that tends to redistribute heat from hotter parts of the wafer 12 to cooler parts, thereby evening the temperature distribution across the wafer 12. Transparent quartz window 20 is disposed between lamps 26 and edge ring 64 for supporting the wafer 12. Pyrometers 40 coupled through optical light pipes 42 are positioned above the wafer 12 to face the side of the wafer 12 being processed. As discussed above, this arrangement results in the more emissive wafer front side is facing the reflector 28, which may be dynamically cooled in the reactor described by Peuse et al.

Although the invention has been discussed in the terms of silicon wafers, the invention is not so limited. Wafers of other materials require thermal treatment as do thin rectangular glass panels used for forming displays. The pyrometers 40 more directly measure the temperature of the IC die since the pyrometer optical light pipes 42 are directly facing the die rather than the side of the wafer 12 opposite the die.

The backside radiant heating of the invention provides much better thermal control and uniformity than the front side radiant heating typically practiced. Furthermore, the thermal monitoring of the wafer front side directly probes the side of the wafer being thermally processed.

The invention claimed is:

1. A rapid thermal processing apparatus for heating substrates having a front side with a plurality of integrated circuit die arranged on the front side except for an edge exclusion zone on a periphery of the substrate and a backside, the apparatus comprising:
    a radiant heat source comprising a plurality of controlled lamps arranged in zones directing radiant energy toward the backside of the substrate and configured to be quickly turned on and off to controllably heat the substrate to above 1000° C. within a minute or less;
    a reflector disposed above said radiant heat source;
    a support defining an annular shelf for holding a substrate between said reflector and said radiant heat source with the front side of said substrate facing said reflector and the annular shelf configured to support the substrate at the edges and within the edge exclusion zone such that the annular shelf does not contact the die; and
    a plurality of pyrometers coupled through optical light pipes positioned to face the front side of the substrate and in communication with the lamps to permit dynamic control of radiant heating intensity during processing, including an outermost light pipe positioned to measure temperature from the support.

2. The apparatus of claim 1, wherein said support comprises a ring supporting a peripheral portion of said substrate.

3. The apparatus of claim 1, wherein said reflector extends generally horizontally over a substantial portion of said radiant heat source.

4. The apparatus of claim 1, wherein said reflector extends over an area greater than that of said substrate.

5. The apparatus of claim 4, wherein the support is located so that a substrate on the support defines cavity between the substrate and the reflector that tends to redistribute heat from hotter parts of the substrate to cooler parts of the substrate, thereby evening the temperature distribution across the substrate.

6. The apparatus of claim 5, further comprising a quartz window disposed between the lamps and the support.

7. A method of rapid thermally processing a substrate in a reactor comprising:
    disposing a substrate in a processing chamber on an edge ring to support the substrate adjacent an array of radiant heating lamps arranged in zones, the substrate having a front side having features formed therein and a backside, the backside of the substrate facing the heating lamps;
    turning the lamps on and off to controllably heat the substrate to above 600° C. within a minute or less;

thermally monitoring said front side of said substrate through a plurality of pyrometers coupled through optical light pipes positioned to face the front side of the substrate with an outermost light pipe positioned to sample only the edge ring, and to measure the temperature of the substrate at a plurality of radial location, the pyrometers generating outputs based upon the temperature; and dynamically controlling radiant heating intensity and heating pattern of the lamps during processing based on outputs from the pyrometer.

8. The method of claim 7, wherein said thermally monitoring step includes measuring temperatures at a plurality of radial positions relative to a center of said substrate.

9. The method of claim 7, further comprising reflecting heat emitted from said back side of said substrate back to said back side across a cavity defined between the substrate and a reflector disposed beneath the substrate.

10. The method of claim 9, further comprising thermally monitoring a plurality of positions on said front side.

* * * * *